United States Patent [19]

Sekihara et al.

[11] Patent Number: 4,625,171
[45] Date of Patent: Nov. 25, 1986

[54] IMAGING APPARATUS USING NUCLEAR MAGNETIC RESONANCE

[75] Inventors: Kensuke Sekihara, Hachioji; Masao Kuroda; Hideki Kohno, both of Tokyo, all of Japan

[73] Assignee: Hitachi, Ltd., Tokyo, Japan

[21] Appl. No.: 579,967

[22] Filed: Feb. 14, 1984

[30] Foreign Application Priority Data

Feb. 14, 1983 [JP] Japan .................................. 58-23547

[51] Int. Cl.$^4$ ........................................... G01R 33/20
[52] U.S. Cl. ..................................... 324/312; 324/309
[58] Field of Search ............... 324/300, 307, 309, 310, 324/312, 320, 313; 364/413, 414, 415; 358/166; 378/19, 901

[56] References Cited

U.S. PATENT DOCUMENTS 4,295,195 10/1981 Hounsfield ............................. 378/19
4,354,157 10/1982 Feiner ................................. 324/309

Primary Examiner—Stewart J. Levy
Assistant Examiner—Kevin D. O'Shea
Attorney, Agent, or Firm—Antonelli, Terry & Wands

[57] ABSTRACT

An NMR imaging apparatus for reconstructing a cross section of a body to be inspected, by the projection-reconstruction method. That is, an apparatus for forming the above cross section in such a manner that the nuclear magnetic resonance is caused by the to-be-inspected body in the resulting magnetic field of a static magnetic field and a rotatable gradient field, a projection of the to-be-inspected body is detected at each rotational positions of the gradient field, and the cross section is reconstructed using the above projection. The apparatus comprises memories for previously storing therein data indicating the distorsion of magnetic field such as the non-uniformity of the static magnetic field and the non-linearity of the gradient field, in order to perform the coordinate calculation in the back projection, using the data stored in the memories.

7 Claims, 8 Drawing Figures

PROJECTION-RECONSTRUCTION METHOD

NON-LINEAR GRADIENT FIELD

CORRECTION OF NON-LINEAR MAGNETIC FIELD

COORDINATE CALCULATION UNDER BACK-PROJECTION

IMAGING APPARATUS USING NUCLEAR MAGNETIC RESONANCE

BACKGROUND OF THE INVENTION

1. Field of the Invention

The present invention relates to an imaging apparatus using the nuclear magnetic resonance (hereinafter referred to as "NMR"), and more particularly to an NMR imaging apparatus which can completely remove the influence of the non-uniformity of a static magnetic field and the non-linearity of gradient fields on a reconstructed cross section, to prevent the image quality of the image indicating the reconstructed cross section from being deteriorated.

2. Description of the Prior Art

An imaging apparatus using the NMR (hereinafter simply referred to as an "imaging apparatus") determines the density distribution or relaxation time distribution of nuclear spin in a body to be inspected, in an nondestructive manner by utilizing the NMR phenomenon, and reconstructs the cross section of a measuring target of the to-be-inspected body, on the basis of the above distribution. Of various imaging methods which have hitherto been proposed, the projection-reconstruction method and the Fourier transform method succeed in forming a high-quality image of the cross section. Of the two methods, the projection-reconstruction method will be explained below. In this method, a uniform static magnetic field and a gradient field rotatable about the to-be-inspected body are used. Further, at each rotational position of the gradient field, projection of the NMR signal which is obtained in the presence of the intensity distribution of the resulting magnetic field, is detected. This projection is back-projected on the coordinate system indicating the cross section of the measuring target, to form an image. Accordingly, in the case where the static magnetic field is not uniform, or in the case where the intensity change of the gradient field is not linear, each projection deviates from a correct position, and the image is blurred.

The static magnetic field is generated by a permanent magnet or a resistive magnet or a superconducting magnet. In either case, it is difficult to form a uniform static field in a field of view. Further, even when a carefully designated coil or magnet is used, the static magnetic field and gradient field will be subjected to external disturbances if the imaging apparatus is not installed at an appropriate place. In such case, it is difficult to form a uniform static field or a linear gradient field in a field of view. Accordingly, the above-mentioned degradation of spatial resolution due to such non-uniformity of the magnetic field is a serious problem in an actual NMR imaging apparatus. A U.S. patent application Ser. No. 420,303 filed by the present assignee on Sept. 20, 1982, now U.S. Pat. No. 4,472,683, relates to an imaging apparatus using the NMR.

SUMMARY OF THE INVENTION

It is an object of the present invention to provide an imaging apparatus which can solve the above-mentioned problem of a conventional imaging apparatus and can completely correct at least the influence of the non-uniformity of a static magnetic field on the image of a cross section.

In order to attain the above object, according to the present invention, there is provided an imaging apparatus utilizing the NMR produced in the resulting field of a static magnetic field, a gradient field, and a high frequency magnetic field applied in the form of a pulse, which comprises memory means for storing therein data indicating the intensity distribution of the static magnetic field in a field of view, to correct back-projection data by the data read out of the memory means, in reconstructing a cross section.

DESCRIPTION OF THE PREFERRED EMBODIMENT

In order to facilitate the understanding of the present invention, a conventional imaging apparatus using NMR will first be explained below in detail, with reference to the drawings.

Figure 1:
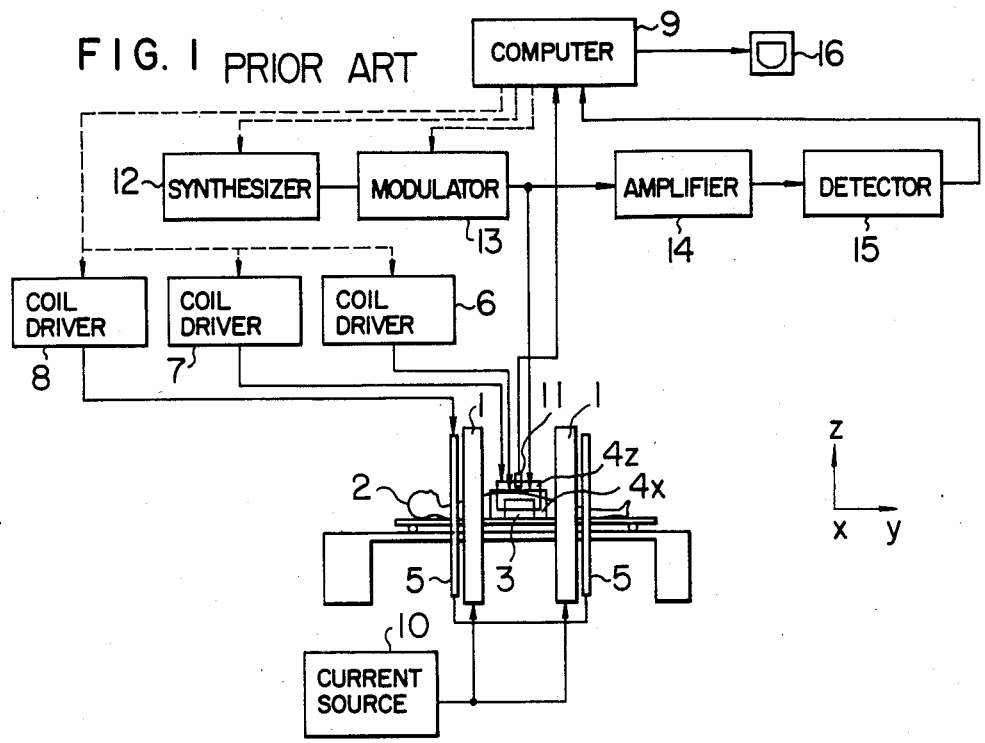
FIG. 1 is a schematic view showing an outline of a conventional imaging apparatus.

FIG. 1 shows an outline of the conventional imaging apparatus. In FIG. 1, reference numerals 1 designate a magnet for generating a static magnetic field $H_o$, 2 a body to be inspected, 3 a detecting coil for generating a high frequency magnetic field and for detecting a signal produced by the to-be-inspected body 2, 4x coil means for generating a gradient field in an x-direction, 4z coil means for generating a gradient field in a z-direction, and 5 coil means for generating a gradient field in a y-direction. Coil drivers 6, 7 and 8 supply currents to the coil means 4x, 4z and 5, respectively, and each of the coil drivers 6, 7 and 8 is operated by a signal from a computer 9. The coil means 5 is formed of a pair of one-turn coils which are connected so as to be opposite in current direction to each other. The intensity of a gradient field generated by the coil means 4x, 4z and 5 can be changed by an instruction from a device 11 for detecting the size of the to-be-inspected body 2 or from the operator of the imaging apparatus. Incidentally, reference numeral 10 designates a current source for exciting the magnet 1.

A high frequency magnetic field for exciting a nuclear spin is formed in such a manner that a high frequency signal generated by a synthesizer 12 is shaped and power-amplified by a modulator 13 and a high frequency current is supplied from the modulator 13 to the coil 3. The signal from the to-be-inspected body 2 is received by the coil 3, pass through an amplifier 14, is subjected to AC-DC conversion at a detector 15, and is then applied to the computer 9. After having processed the applied signal, the computer 9 displays on a CRT display 16 a picture image corresponding to the density distribution or relaxation time distribution of nuclear spin.

An image corresponding to the density distribution or relaxation time distribution of nuclear spin in a three-dimensional body to be inspected (hereinafter referred to as a "to-be-inspected body"), is usually formed in the following manner. First, a specified two-dimensional plane is selected by one of the following methods, that is, the selective irradiation method (refer to, for example, an article entitled "Medical Imaging by NMR" by P. Mansfield et al., British Journal of Radiology, Vol. 50, 1977, pages 188 to 194), and the vibrating gradient field method (refer to, for example, an article entitled "Experimental considerations in implementing a whole body mutiple sensitive point nuclear magnetic resonance imaging system" by W. S. Moore et al., Phil. Trans. R. Soc. Lond. B289, 1980, pages 511 to 518). The image of the selected two-dimensional plane can be formed by the projection-reconstruction method.

Figure 2A:
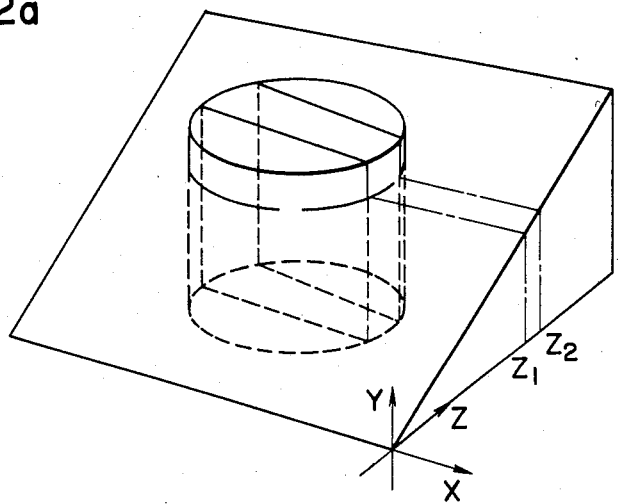
FIGS. 2a and 2b are views for explaining the principle of the projection-reconstruction method.
Figure 2B:
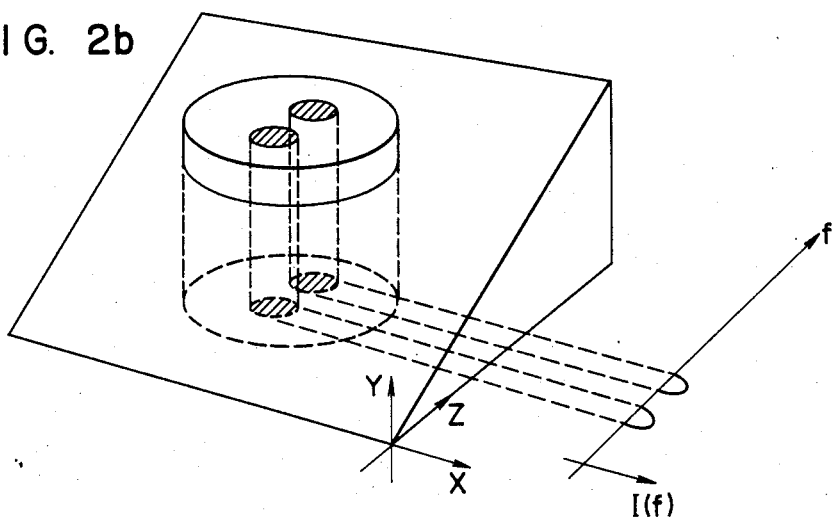

FIGS. 2a and 2b show the principle of the projection-reconstruction method. Referring to FIGS. 2a and 2b, let us assume that the to-be-inspected body is uniform in the y-direction and a plane parallel to the x-z plane is reconstructed in the form of an image. Incidentally, FIGS. 2a and 2b show the case where a gradient field is applied in the z-direction, by way of example.

Owing to the NMR phenomenon, a nuclear spin placed in a static magnetic field H resonates with a high frequency wave having a frequency $f=\gamma H/2\pi$, where $\gamma$ indicates a gyromagnetic ratio. When the intensity of the static magnetic field and the intensity increment of the gradient field per unit length are expressed by $H_o$ and $G$, respectively, the nuclear spin existing in a $z_1$-plane which is shown in FIG. 2 and is parallel to the x-z plane, resonates with a high frequency wave having a frequency $f_1=\gamma(H_o+Gz_1)/2\pi$, and the nuclear spin existing in a $z_2$-plane resonates with a high frequency wave having a frequency $f_2=\gamma(H_o+Gz_2)/2\pi$. Accordingly, when the intensity I(f) of the resonance signal obtained from the to-be-inspected body which is uniform in the y-direction, is plotted against the resonance frequency f as shown in FIG. 2b, there is provided the projection of the density distribution of nuclear spin on the z-axis. Accordingly, the intensity I(f) versus frequency f characteristic curve is hereinafter referred to as a "projection". In the above description, explanation has been made on the case where the gradient field is formed in the z-direction, by way of example. However, the gradient field is formed in each of a multiplicity of directions obtained between a given direction and the direction opposite thereto, the above-mentioned projection is formed in each direction, and a cross section is reconstructed using the projections.

A cross section can be reconstructed from the above-mentioned projections in the same manner as in the X-ray computed tomography, for example, by the filtered back projection method (refer to an article entitled "The Fourier Reconstruction of A Head Section" by L. A. Shepp et al., IEEE Trans. Nucle. Sci. Vol. NS-21, 1974, pages 21 to 42). In the filtered back projection method, filtering is carried out for the above-mentioned projection by means of a spatial frequency filter, and the projection thus processed is subjected to back projection.

In the foregoing explanation, it has been assumed that the static magnetic field is completely uniform in a field of view and the intensity change of the gradient field is linear. However, as a matter of fact, there are some cases where the static magnetic field has an intensity distribution in a field of view and the intensity change of the gradient field is not linear. In such cases, there arises a problem that the projection is erroneously positioned along the frequency axis, that is, a value indicating the intensity of the resonance signal is plotted at a frequency different from a correct frequency.

Let us first consider the case where a static magnetic field is not uniform but has an intensity distribution, in a field of view. When the intensity of the static magnetic field at a position (x, z) in the field of view is deviated from a desired intensity $H_o$ by a value $\Delta H(x, z)$, the nuclear spin at the position (x, z) resonates with a high frequency wave having a frequency which given by the following equation:

$$f=(\gamma(H_o+Gz)/2\pi)+\gamma\Delta H(x, z)/2\pi \qquad (1)$$

That is, when the above position is projected on the frequency-axis, the following frequency error $f_\epsilon$ is produced on the frequency-axis.

$$f_\epsilon=\gamma\Delta H(x, z)/2\pi \qquad (2)$$

Even the static magnetic field formed by the best one of the magnets which are available at the present, has an intensity variation of about $3\times 10^{-3}$ percent or less in a field of view having a diameter of 400 mm. That is, when the static magnetic field has an intensity of 3,000 gauss, a frequency error is produced which is given by the following equation:

$$f_\epsilon=\gamma\cdot(3,000)\cdot(3)\cdot(10^{-5})/2\pi$$

In other words, the frequency error $f_\epsilon$ is about 400 Hz.

In the case where a gradient field having an intensity gradient of 0.2 gauss/cm is applied to a field of view together with the above static magnetic field and 256 samples are taken out of a projection, the internal of the discrete frequencies per one sample is given as follows:

$$\Delta f=\gamma\cdot(0.2)\cdot(40)/(256\times 2\pi)$$

That is, the internal of the discrete frequencies $\Delta f$ is about 130 Hz. Accordingly, a ratio of the frequency error $f_\epsilon$ to the $\Delta f$ is nearly equal to 3 (namely, $f_\epsilon/\Delta f \approx 3$). When the back projection is performed without correcting each sample, a blur corresponding to three picture elements or less is produced on the image of the reconstructed cross section.

The above-mentioned image blurring can be reduced by increasing the intensity gradient of the gradient field. In this case, however, it is required to make large the frequency band-width of the receiver. That is, there arises a new problem that it is required to sacrifice the S/N ratio of the image indicating the reconstructed cross section, since the S/N ratio of a received signal is inversely proportional to the square root of the frequency band-width of the receiver.

Figure 3A:
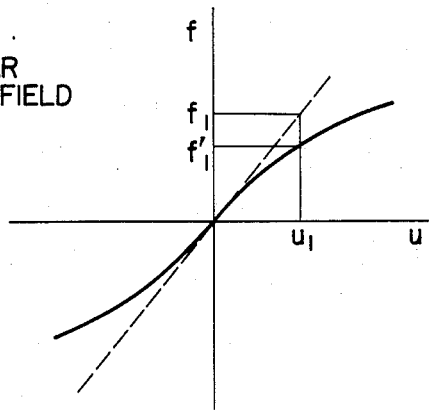
FIG. 3a is a graph showing an example of a non-linear gradient field.

Next, let us consider the case where the intensity change of a gradient field is non-linear. FIG. 3a shows an example of a gradient field having a non-linear intensity gradient. In FIG. 3a, the abscissa indicates a spatial coordinate u in a direction in which a gradient field is applied, and the ordinate a resonance frequency f. When a gradient field has a linear intensity gradient as indicated by a broken line in FIG. 3a, the nuclear spin at a position $u_1$ resonates with a high frequency wave having a frequency $f_1$. However, when a gradient field having a non-linear intensity gradient is used, the nuclear spin at the position $u_1$ resonates with a high frequency wave having a frequency $f_1'$ which is different from the frequency $f_1$. Thus, similarly to the non-uniformity of the static magnetic field, the non-linearity of the gradient field leads to a frequency error in a projection, and produces a blur on the image of a reconstructed cross section.

The above-mentioned non-linearity of a gradient field can be reduced by making a gradient field generating coil far larger in size than a field of view, and by using only that central portion of the magnetic field formed by the coil which has a substantially linear intensity gradient. However, a large amount of electric power is required to drive a large-sized, gradient field generating coil. Further, it is usually required to mount a gradient field generating coil in the magnet for forming a static magnetic field, and therefore the size of the coil is limited by the size of the bore of the magnet. Thus, under the present conditions, a non-linearity of 5 to 10 percent in the gradient field is unavoidable.

Now, an imaging apparatus according to the present invention will be explained below in detail, with reference to the drawings.

Figure 4:
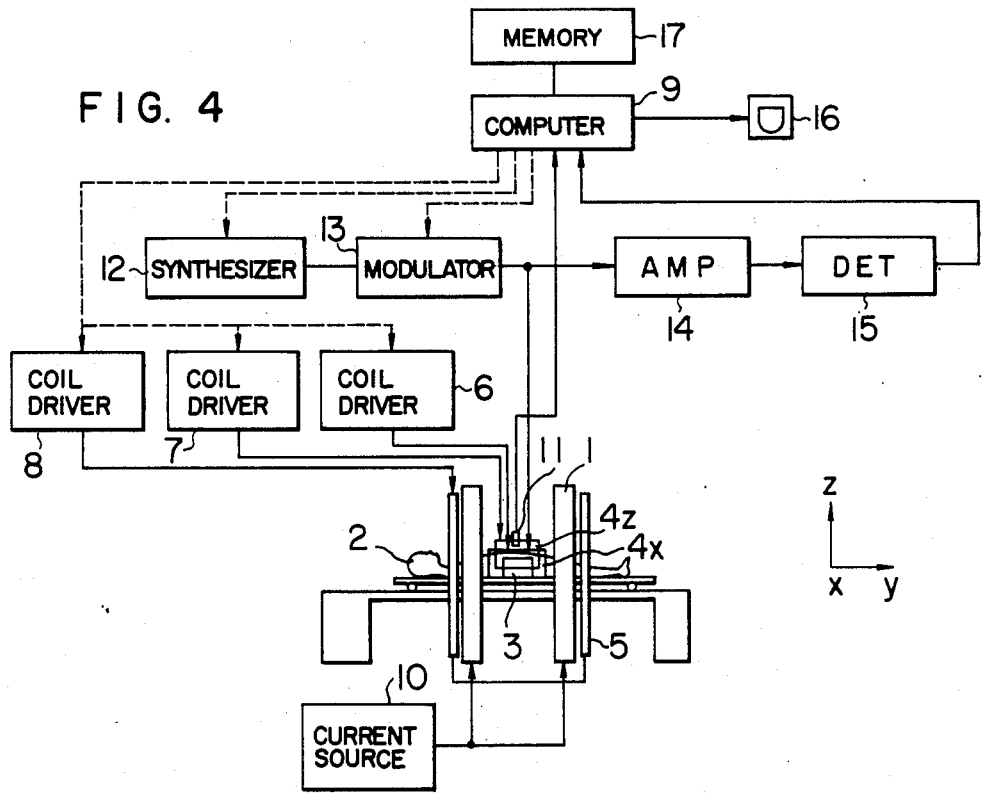
FIG. 4 is a schematic view showing an outline of an embodiment of an imaging apparatus according to the present invention.
Figure 5:
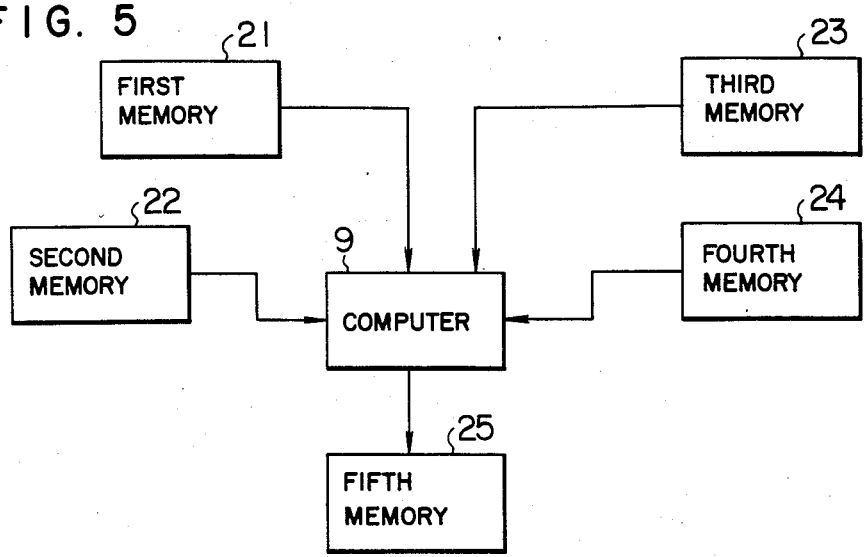
FIG. 5 is a block diagram showing the memory configuration of a main part of the embodiment shown in FIG. 4.

FIG. 4 shows an outline of an embodiment of an imaging apparatus according to the present invention. In FIG. 4, reference numerals 1 to 16 designate the same parts as shown in FIG. 1, and 17 is a memory means for storing therein data of each of the static magnetic field and gradient field and other data. As shown in FIG. 5, the memory means 17 includes first, second, third, fourth and fifth memories 21 to 25, each of which is connected to the computer 9. The details of each memory will be explained later.

Now, the operation of the present embodiment will be explained below. In the following description, spatial coordinates of a point in a field of view, an intensity increment of a gradient field per unit length, and the diameter of the field of view will be expressed by (x, z), G and l, respectively. Further, explanation will be made on the case where discrete samples are taken out of a projection at N points on the frequency axis and a cross section including NXN points in the form of a matrix is reconstructed.

Now, let us denote the projection at a resonance frequency f as $I_\theta(f)$ for the case where the direction of a gradient field makes an angle $\theta$ with a specified direction, for example, the z-axis. Values of $I_\theta(f)$ are given at discrete frequencies $f_n$ (where n=0, 1, 2, ..., N−1). The frequencies $f_n$ are set as indicated by the following equations:

$$f_n = f_c + \left(n - \frac{N}{2}\right) \Delta f \quad \quad (3)$$
$$\Delta f = \gamma Gl/2\pi N$$

where $f_c$ indicates the resonance frequency of the nuclear spin existing at the center of the field of view, and $\Delta f$ the interval of the discrete frequencies.

Figure 6:
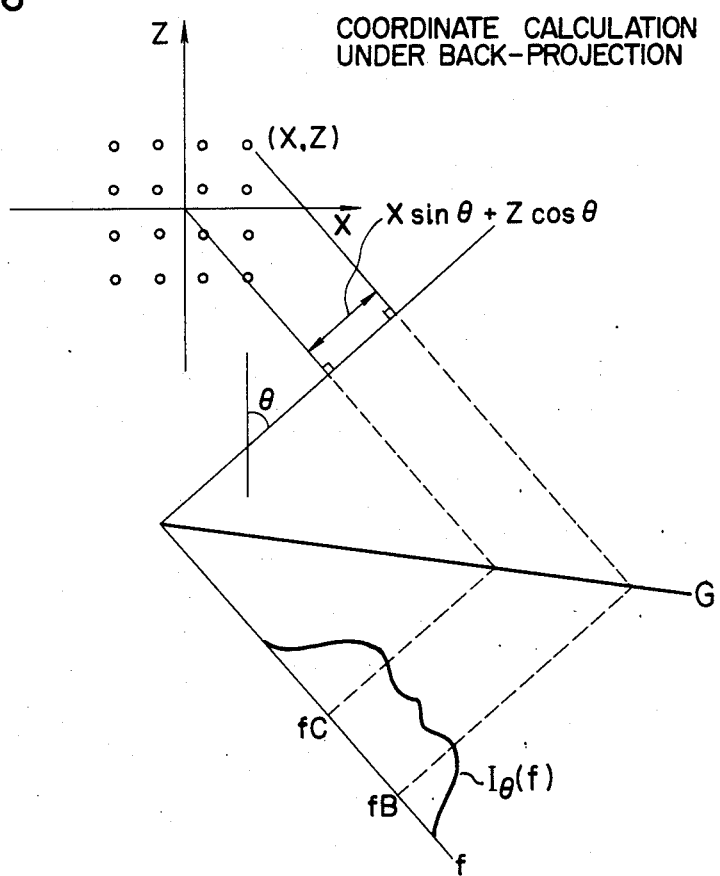
FIG. 6 is a view for explaining the coordinate calculation in the back-projection process.

First, explanation will be made on the case where the static magnetic field is uniform and the intensity change of the gradient field is linear. When a projection obtained in the case where the direction of the gradient field makes the angle $\theta$ with the z-direction, is projected back on an image indicating a cross section, the frequency $f_B$ of data projected back on the picture image at a point (x, z) is given by the following equation:

$$f_B = \frac{1}{2\pi} \gamma G (x \sin\theta + z \cos\theta) + f_c \quad \quad (4)$$

where the origin of the x-z coordinate system is the center of the field of view. FIG. 6 shows the relation among the position (x, z), the frequency $f_B$ and the frequency $f_c$. The projection $I_\theta(f)$ shown in FIG. 6 is actually given at discrete frequencies. Accordingly, data to be projected back on the image at the point (x, z) is determined in the following manner. Now, let us express the largest one of integers which do not exceed a number a, by [a]. An integer m is determined as follows:

$$m = \left[\frac{N}{2} + \frac{f_B - f_c}{\Delta f}\right] \quad \quad (5)$$

Further, a value $\delta$ is given by the following equation:

$$\delta = f_B - f_m \quad \quad (5)'$$

Finally, the value g is calculated from the following equation:

$$g = (1-\delta) I_\theta(f_m) + \delta I_\theta(f_{m+1}) \quad \quad (6)$$

Then, the value g is projected back on the image at the point (x, z), from a point which exists on a coordinate axis making an angle $\theta$ with the z-axis and corresponds to the frequency $f_B$.

The above-mentioned equations are applied in the case where the static magnetic field is uniform and the intensity change of the gradient field is linear.

Next, explanation will be made on the case where the intensity of a static magnetic field deviates from a predetermined value $H_o$ by an amount $\Delta H$ (x, z). In this case, the frequency error $f_\epsilon$ given by the equation (2) is produced when nuclear spin distribution is projected (or reflected) on the signal intensity-frequency plane. Accordingly, when the value of I ($f_B'$) at the following corrected frequency $f_B'$ is back-projected on a image at the point (x, z) in place of the value of I ($f_B$) at the frequency $f_B$ which is given by the equation (4), the image indicating a reconstructed cross section is formed which is not affected by the non-uniformity of the static magnetic field.

$$f_B' = \frac{1}{2\pi} \gamma G (x \sin\theta + z \cos\theta) + f_\epsilon + f_c \quad \quad (7)$$

In an actual imaging apparatus, the value of $I_\theta(f)$ is given only at discrete frequencies, as mentioned previously. Accordingly, a value g' indicating the above-mentioned $I_\theta(f_B')$ is calculated by the linear interpolation method, and the value g' is back-projected onto the point (x, z) on an image matrix. That is, an integer m' is determined as follows:

$$m' = \left[\frac{N}{2} + \frac{f_B' - f_c}{\Delta f}\right] \quad \quad (8)$$

Further, a value $\delta'$ is given by the following equation:
$$\delta' = f_B' - f_{m'}' \quad \quad (8)'$$

Then, the value g' is calculated from the following equation:

$$g' = (1-\delta') I_\theta(f_m') + \delta' I_\theta(f_m'+1) \quad (8)''$$

Though the equation (8)" has been derived by the linear interpolation method, the value indicating the above-mentioned $I_\theta(f_B')$ may be calculated by other interpolation methods.

Next, explanation will be made of the correction which is made in the case where the intensity change of a gradient field is non-linear. When the gradient field having a non-linear intensity gradient is formed in the direction making an angle $\theta$ with the z-direction, a relation between the resonance frequency and the coordinate value u in the above direction is given as follows:

$$f_1' = \gamma B_\theta(u)/2\pi \quad (9)$$

In the case where the above function $B_\theta(u)$ is known, the error caused by the non-linearity of the gradient field can be removed by using the following frequency $f_B''$ in the calculation of data which is to be back-projected on an image matrix at a point (x, z), in place of the frequency $f_B$ given by the equation (4).

$$f_B'' = \frac{1}{2\pi} \gamma B_\theta (x \sin\theta + y \cos\theta) + f_c \quad (10)$$

Figure 3B:
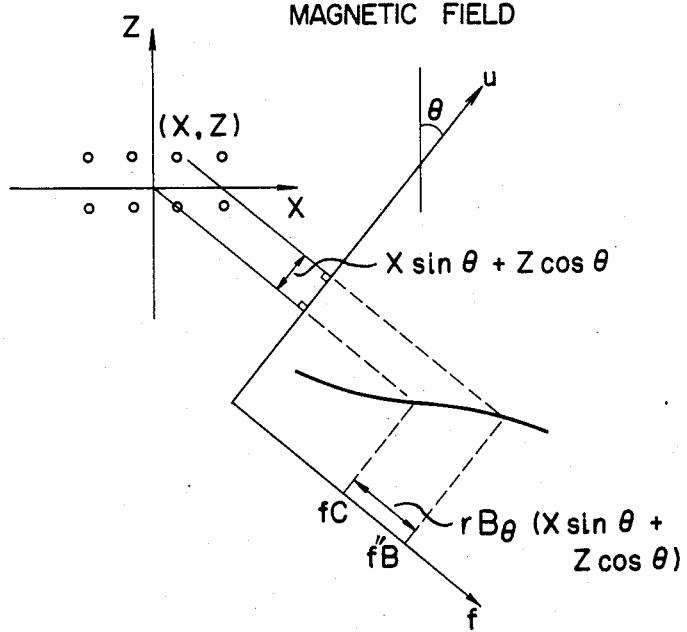
FIG. 3b is a graph for explaining the correction made for the non-linear gradient field.

FIG. 3b shows a relation among the point (x, z), the frequency $f_B''$ and the frequency $f_c$. That is, after the frequency $f_B''$ has been determined by the equation (10), an integer m" is determined as follows:

$$m'' = \left[ \frac{N}{2} + \frac{f_B'' - f_c}{\Delta f} \right] \quad (11)$$

Further, a value $\delta''$ is given by the following equation:
$$\delta'' = f_B'' - f_m'' \quad (11)'$$

Then, a value g" is calculated from the following equation:

$$g'' = (1-\delta'') I_\theta(f_m'') + \delta'' I_\theta(f_m''+1) \quad (12)$$

The value g" thus obtained is projected back on the point (x, z). In the case where the static magnetic field is not uniform and the intensity change of the gradient field is not linear, the two correction methods are combined. That is, a value g is calculated from the equations (5), (5)' and (6) using a frequency $f_B$ which is given by the following equation:

$$f_B = \frac{1}{2\pi} \gamma B_\theta (x \sin\theta + z \cos\theta) + f_\epsilon + f_c \quad (13)$$

The above-mentioned value g is back-projected on the point (x, z), and thus desired correction is performed.

Further, in the case where the intensity change of a gradient field is non-linear and unknown, the value of a factor $B_\theta(x \sin\theta + z \cos\theta)$ in the equation (13) can be calculated by the following two methods.

Method (a): In this method, using measured values $B_\theta(u_0), B_\theta(u_1), \ldots, B_\theta(u_{L-1})$ of the intensity of the gradient field at a finite number of positions $u_0, u_1 \ldots u_{L-1}$, the function $B_\theta'(u)$ indicating the intensity change of the gradient field is approximated with a polynominal as follows:

$$B_{\theta'}(u) = \sum_{k=0}^{K'-1} a_k u^k \quad (14)$$

where u indicates a spatial coordinate in a direction in which the gradient field is applied, and L the number of measured points. That is, a number K satisfying a relation K<L is selected, and the coefficients $a_k$ (where k=0, 1, ..., K−1) are determined from the measured values $B_\theta(u_0), B_\theta(u_1), \ldots B_\theta(u_{L-1})$ by the method of least squares. Thus, the equation (14) is determined, and the value of $B_\theta'$ (x sin $\theta$ + z cos $\theta$) calculated from equation (14) is used as an approximate value of $B_\theta(x \sin\theta + z \cos\theta)$.

Method (b): In this method, the intensity change of the gradient field is approximated with a broken line on the basis of the measured values $B_\theta(u_0), B_\theta(u_1), \ldots$ and $B_\theta(u_{L-1})$. That is, an integer $\zeta$ satisfying the following formula (15) is first determined.

$$u_{70} \leqq x \sin\theta + z \cos\theta < u_{\zeta+1} \quad (15)$$

Further, values $\eta_1$ and $\eta_2$ are given by the following equations:

$$\left. \begin{array}{l} \eta_1 = x \sin\theta + z \cos\theta - u_\zeta \\ \eta_2 = u_{\zeta+1} - (x \sin\theta + z \cos\theta) \end{array} \right\} \quad (16)$$

Then, a value of $B_\theta''(x \sin\theta + z \cos\theta)$ is calculated from the following equation:

$$B_\theta'' (x \sin\theta + z \cos\theta) = \frac{\eta_1 B_\theta(u_{\zeta+1}) + \eta_2 B_\theta(u_\zeta)}{\eta_1 + \eta_2} \quad (17)$$

The value thus obtained is used as an approximate value of $B_\theta(x \sin\theta + z \cos\theta)$.

In the above description, the two methods for obtaining an approximate value of $B_\theta(x \sin\theta + z \cos\theta)$ have been explained. In either method, the measuring points $u_0, u_1, \ldots u_{L-1}$ along the gradient field have to be selected so as to sufficiently cover a field of view. Further, in the case where the intensity distribution of the gradient field varies with the angle $\theta$, the values of the coefficients $a_k$ in the method (a) vary each time the gradient field is rotated.

Now, an actual circuit configuration for calculating the equation (13) will be explained, with reference to FIG. 5. When x- and z-coordinates of one corner of the image (indicating a reconstructed cross section), a difference in x-coordinate between picture elements adjacent to each other in the x-direction, and a difference in z-coordinate between picture elements adjacent to each other in the z-direction are expressed by $(x_o, z_o)$, $\Delta x$, and $\Delta z$, respectively, the coordinates of the picture element in the j-th row, the i-th column are given by the following equations:

$$x_i = x_o + (i-1) \Delta x, \text{ and } z_j = z_o + (j-1) \Delta z$$

Further, when the angular interval between adjacent rotational positions of a rotatable gradient field and the angle between the z-axis and a direction in which the gradient field is applied, are expressed by $\Delta\theta$ and $t\Delta\theta$, respectively, values of x sin (t$\Delta\theta$) + z cos (t$\Delta\theta$) are stored in the first memory 21, and values of $\Delta x$ sin (t$\Delta\theta$) and values of $\Delta z$ cos (t$\Delta\theta$) are stored in the second memory 22, (where t=1, 2, ..., M). Incidentally, the above-mentioned M indicates the number of rotational positions of the gradient field, and t the number of each rotational position. The equation (13) is calculated as follows.

Step I

The computer 9 fetches a value of $x_o \sin(t\Delta\theta) + z_o \cos(t\Delta\theta)$ and values of $\Delta x \sin(t\Delta\theta)$ and $\Delta z \cos(t\Delta\theta)$ from the first and second memories 21 and 22, respectively, and calculates values of u from the following equation:

$$u = x_o \sin(t\theta) + z_o \cos(t\Delta\theta) + (i - 1) \Delta x \sin(t\Delta\theta) +$$
$$(j - 1) \Delta z \cos(t\Delta\theta) = x_i \sin(t\Delta\theta) + z_j \cos(t\Delta\theta)$$

Step II

The value of u obtained in the step I is corrected in accordance with a non-linear gradient field. First, explanation will be made on the case where the previously-mentioned method (a) is used. The third memory 23 previously stores therein values of $a_k$ where $k=0, 1, \ldots, K-1$) for all values of t. The computer 9 fetches a set of $a_k$ for a specified value of t from the memory 23, and performs the calculation shown in the equation (14).

Further, in the case where the method (b) is used, values of $B_\theta(u_e)$ (where $l=0, 1, \ldots, L-1$) for all values of t are previously stored in the third memory 23. The computer 9 fetches a set of $B_\theta(u_e)$ for a specified value of t from the memory 23, and performs the calculations shown in the equations (15), (16) and (17). The result thus obtained is used as $B_\theta(u)$. That is, the $B_\theta(u)$ is given by the following equation.

$$B_\theta(u) = \frac{\eta_1 B_\theta(u_{\zeta+1}) + \eta_2 B_\theta(u_\zeta)}{\eta_1 + \eta_2}$$

Step III

Next, the error caused by the non-uniformity of a static magnetic field is corrected. The deviation $\Delta H(x_i, z_j)$ of the intensity of the static magnetic field from a standard value, at positions corresponding to all the picture elements is previously stored in the fourth memory 24 (where $i=1, 2, \ldots N$, and $j=1, 2, \ldots, N$). The value of $\gamma \Delta H(x_i, z_j)$ corresponding to a predetermined position $(x_i, z_j)$ is loaded in the computer 9, to be added to the value obtained from the equation (14) or (17). The result of addition is stored in the fifth memory 25. That is, the value of factor $$\frac{2\pi(f_B - f_c)}{\gamma}$$

derived from the equation (13) is determined for the predetermined position $(x_i, z_j)$ and a specified value of t, and the value thus determined is stored in the fifth memory 25.

Step IV

Data to be back-projected onto the point $(x_i, z_j)$ is calculated from the equations (5), (5)' and (6), using the above-mentioned value of $$\frac{2\pi(f_B - f_c)}{\gamma}.$$

In the foregoing explanation, the correction for the deviation of a-magnetic field from an ideal state has been made by correcting the coordinate of data which is to be subjected to the back projection. This method is advantageous in that the calculation for correcting the above coordinate can be performed by a conventional calculating device for calculating the image of a reconstructed cross section if the calculating device is modified only a little.

Next, explanation will be made of a method in which the correction for the non-linearity of a gradient field is made by recalculating a projection (namely, the frequency characteristic of resonance signal) in accordance with the intensity distribution of a gradient field.

Now, let us consider a projection which is obtained when the direction of the gradient field makes an angle $\theta$ with the z-axis. When the spatial coordinate in the direction of the gradient field is expressed by u, let us express the relation between the position on such a coordinate axis and the resonance frequency f by the following equation:

$$f = \frac{1}{2\pi} \gamma B_\theta(u) + f_c \tag{18}$$

Further, let us consider the case where the value of projection $I_\theta(f)$ has been measured at discrete frequencies in the state the gradient field having a non-linear intensity gradient is applied, that is, the case where the values of $I_\theta(f_i)$ (where $i=1, 2, \ldots, N$) have been known. If a gradient field having a linear intensity gradient is applied in place of the gradient field having the non-linear intensity gradient, the resonance frequency f expressed by the equation (18) will be changed to a frequency f' which is expressed by the following equation:

$$f' = \frac{1}{2\pi} \gamma G u + f_c \tag{19}$$

In other words, a nuclear spin which exists at a position u and is to resonate with a high frequency wave having the frequency f', resonates with a high frequency wave having the frequency f because of the non-linearity of the gradient field. Accordingly, from the equations (18) and (19), the following equation is derived.

$$f = \frac{1}{2\pi} \gamma B_\theta\left(\frac{2\pi(f' - f_c)}{\gamma G}\right) + f_c \tag{20}$$

When the measured value of the projection at the frequency f and the corrected projection are expressed by $I_\theta(f)$ and $I_\theta'(f)$, respectively, a function $I_\theta'(f')$ is calculated from $I_\theta'(f')=I_\theta(f)$ using the equation (20). The corrected projection $I_\theta'(\theta')$ thus obtained is used in forming the image of a reconstructed cross section, to correct the influence of the non-linearity of the gradient field. In fact, the value of the projection $I_\theta(f)$ is given at discrete frequencies $f_i$ (where $i=1, 2, \ldots, N$). Accordingly, the corrected projection $I_\theta'(f_i)$ at a frequency $f_i$ is determined in the following manner. First, a frequency f is calculated from an equation $$f = \frac{1}{2\pi} \gamma B_\theta\left(\frac{2\pi(f_i + f_c)}{\gamma G}\right) + f_c$$

on the basis of the equation (20). The factor $$B_\theta \left( \frac{2\pi(f_i - f_c)}{\gamma G} \right)$$

in the above equation is calculated by the previously mentioned method (a) or (b). Next, an integer I satisfying a formula $f_I \leq f < f_{I+1}$ is determined from the frequencies $f_i$ (where $i=1, 2, \ldots, N$) at which the measured value of $I_\theta(f_i)$ has been known. Further, values $\Delta_1$ and $\Delta_2$ are determined from the equations $\Delta_1 = f - f_I$ and $\Delta_2 = f_{I+1} - f$. Then, the value of $I'_{74}(f_i)$ is calculated from the following equation:

$$I_\theta'(f_i) = \frac{\Delta_2 I_\theta(f_I) + \Delta_1 I_\theta(f_{I+1})}{\Delta_1 + \Delta_2}$$

where $i=1, 2, \ldots, N$.

The above-mentioned $I_{\theta'}(f_i)$ is the corrected projection at the frequency $f_i$. That is, the influence of the non-linearity of the gradient field is not found in the projection $I_\theta'(f_i)$. Such a corrected projection is determined for all rotational positions of the rotatable gradient field. When the corrected projections thus determined are used in forming the picture image of a reconstructed cross section, a picture image which is not affected by the non-linearity of the gradient, can be formed by the filtered back projection method or the convolution method. Further, as a matter of course, both the influence of the non-linearity of a gradient field and the influence of the non-uniformity of a static magnetic field can be removed in such a manner that the above-mentioned corrected projection $I_\theta'(f_i)$ is used in forming an image and the previously-mentioned method for correcting the influence of the non-uniformity of a static magnetic field is used in performing the back-projection.

Further, when the reconstructed image of cross section is formed in such a manner that the projection $I_\theta'(f_i)$ in which the correction for the non-linearity of a gradient field has been made, is used, and a two-dimensional high-speed Fourier transformation algorithm is used after the polar coordinate-orthogonal coordination conversion has been made in a spatial frequency domain, an image which is not affected by the non-linearity of a gradient field, can be formed at high speed.

Now, a method of measuring the intensity distribution of a magnetic field in a field of view will be additionally explained. The present invention deals with the non-uniformity of a static magnetic field and the non-linearity of a gradient field which correspond to about 0.001 percent of the intensity of the static magnetic field. Such high-accuracy measurement cannot be made by a conventional magnetic field measuring device (since the measuring accuracy of, for example, a gaussmeter is about 0.1 percent of the intensity of a static magnetic field), but can be performed by a method which utilizes the NMR phenomenon in the following manner. That is, the frequency of the resonance signal is measured at various positions in a field of view by moving a probe which is formed by winding a signal detecting coil round a tube having a diameter of about 1 mm and filled with a substance to be imaged (for example, water). As mentioned previously, the frequency f of the resonance signal is proportional to the intensity H of the magnetic field, and the proportional constant is equal to a gyromagnetic ratio. Accordingly, the value of the magnetic field intensity H at a position can be determined very accurately from the frequency f of the resonance signal obtained at this position.

As has been explained in the foregoing, according to the present invention, an imaging apparatus utilizing the NMR and using the resulting field of a static magnetic field, a gradient field, and a high frequency magnetic field applied in the form of a pulse, comprises memory means for storing therein at least data of the intensity distribution of the static magnetic field in a field of view or data calculated from the intensity distribution, and when the reconstructed image of cross section is formed, data to be back-projected on the image is corrected by data read out of the memory means. That is, there is provided an imaging apparatus which can completely correct the influence of the non-uniformity of the static magnetic field. Further, the influence of the non-linearity of the gradient field can be completely corrected in a similar manner.

We claim:

1. An imaging apparatus for obtaining a nuclear spin distribution image of an object along a two-dimensional section, comprising:

means for generating a static magnetic field which has an intensity error distribution along said two-dimensional section;

exciting means for repeatedly exciting nuclear spins in said object by repeatedly applying a pulsive high frequency magnetic field;

means for generating a gradient magnetic field successively along each of a plurality of different directions across said two-dimensional section to produce frequency dispersion of nuclear spins along each of the directions;

signal detecting means for detecting nuclear magnetic resonance signals induced during generation of said gradient magnetic field for a plurality of different directions thereof;

memory means for storing data of said intensity error distribution of said static magnetic field;

computer means for performing operations for each of said nuclear magnetic resonance signals detected by said signal detecting means to reconstruct an image in accordance with at least data read out from said memory means, said computer means performing the operations of analyzing a frequency spectrum of each of said nuclear magnetic resonance signals to obtain a projection along a frequency axis, and projecting back a value of said projection at each frequency to each picture point of said image to be reconstructed, said frequency being a resonance signal at said image point, said computer means correcting a frequency error of said frequency caused by said intensity error distribution of said static magnetic field in accordance with data read out from said memory means; and display means responsive to said computer means for displaying the reconstructed image.

2. An imaging apparatus using the nuclear magnetic resonance according to claim 1, wherein said memory means includes a first memory for storing data of said intensity error distribution of said static magnetic field and a second memory for storing data with respect to the non-linearity of said gradient field, said computer means correcting said nuclear magnetic resonance signal by both said data read out from said first memory and said second memory.

3. An imaging apparatus using the nuclear magnetic resonance according to claim 1, wherein said memory means stores therein as the data of the intensity error distribution of said static magnetic field data of the derivative $\Delta H (x, z)$ of the intensity of said static magnetic field from a predetermined value $H_o$ at each $(x, z)$ of picture points on an image, on which said nuclear magnetic resonance signal is back-projected.

4. An imaging apparatus using the nuclear magnetic resonance according to claim 3, wherein said computer means projects back the value $I_\theta(f_B')$ of said nuclear magnetic resonance signal at a corrected frequency $f_B'$ which is given by the following equation on a corresponding one $(x, z)$ of said picture points $$f_B' = \frac{1}{2\pi} \gamma G (x \sin\theta + z \cos\theta) + f_\epsilon + f_c$$

where $f_c = \Delta H_o/2\pi$, $f_\epsilon = \gamma \Delta H (x, z)/2\pi$, $\gamma$ is a gyromagnetic ratio, G is an increment of the intensity of said gradient field per unit length, and $\theta$ is an angle between a z-axis and the direction of the intensity gradient of said gradient field.

5. An imaging apparatus using the nuclear magnetic resonance according to claim 4, wherein said computer means calculate a value $I_\theta(f_m')$ of said nuclear magnetic resonance signal from discrete detection signals by the linear interpolation method.

6. An imaging apparatus using the nuclear magnetic resonance according to claim 2, wherein said second memory stores said data with respect to the non-linearity of said gradient field as coefficients of a polynominal, with which the intensity distrubution of said gradient field is approximated.

7. A method for obtaining a nuclear spin distribution image of an object along a two-dimensional section, comprising the steps of:

generating a static magnetic field;

detecting an intensity error distribution of said static magnetic field along said two-dimensional section and storing data of said intensity error distribution in a memory means;

repeatedly exciting nuclear spins in said object within said static magnetic field;

generating a gradient magnetic field successively along each of a plurality of different directions across said two-dimensional section to produce frequency dispersion of nuclear spins along each direction;

detecting nuclear magnetic signals induced during said gradient magnetic field for a plurality of different directions thereof;

analyzing frequency spectrums of respective nuclear magnetic resonance signals to obtain respective projections along a frequency axis;

projecting back respective values of said respective projections at respective frequencies to respective picture points of an image to be reconstructed, said respective frequencies being respective resonance signals at said respective image points, and correcting frequency errors of said frequencies caused by said intensity error distribution of said static magnetic field in accordance with date read out from said means; and displaying back-projected values at respective image points.

* * * * *